(12) United States Patent       (10) Patent No.:     US 8,487,777 B2
    Lu                          (45) Date of Patent:     Jul. 16, 2013

(54) SEMICONDUCTOR STORAGE APPARATUS AND EARLY-WARNING SYSTEMS AND METHODS FOR THE SAME

(75) Inventor: Saiwen Lu, Guangdong (CN)

(73) Assignee: Netac Technology Ltd, Shenzhen, Guangdong (CN)

( * ) Notice: Subject to any disclaimer, the term of this patent is extended or adjusted under 35 U.S.C. 154(b) by 313 days.

(21) Appl. No.: 13/000,945

(22) PCT Filed: Jul. 10, 2009

(86) PCT No.: PCT/CN2009/072717
§ 371 (c)(1),
(2), (4) Date: Mar. 16, 2011

(87) PCT Pub. No.: WO2010/003384
PCT Pub. Date: Jan. 14, 2010

(65) Prior Publication Data
US 2011/0156919 A1    Jun. 30, 2011

(30) Foreign Application Priority Data
Jul. 10, 2008    (CN) .......................... 2008 1 0068480

(51) Int. Cl.
*G08B 21/00*    (2006.01)
(52) U.S. Cl.
USPC ............ 340/635; 340/3.3; 711/156; 711/166; 711/E12.103

(58) Field of Classification Search
USPC ................... 340/635, 641, 653, 691.1, 691.6, 340/2.29, 3.3, 3.7; 711/103, 106, 156, 166, 711/E12.008, E12.103
See application file for complete search history.

(56) References Cited

U.S. PATENT DOCUMENTS
7,437,522 B2 * 10/2008 Bungo .......................... 711/156

FOREIGN PATENT DOCUMENTS
CN    1755649 A    4/2006
CN    1936818 A    3/2007
CN    101079324 A   11/2007

* cited by examiner

*Primary Examiner* — Toan N Pham
(74) *Attorney, Agent, or Firm* — Ladas & Parry LLP

(57) ABSTRACT

Provided are early-warning methods and early-warning devices for indicating a usage condition of a semiconductor storage device comprising a semiconductor storage medium. The semiconductor storage medium comprises a plurality of physical storage blocks. The method comprises: retrieving a usage condition value; comparing the usage condition value with a preset threshold; and providing an early-warning signal based on a result of the comparison, wherein the usage condition value comprises one of an average number of used times of the blocks and a maximum number of used times of the blocks. Since the early-warning is used to indicate the usage condition information of the semiconductor storage medium, users may be aware of when the lifetime of the semiconductor storage medium will expire so that important data can be backed up before the storage device is aged, thus ensuring safety of the data and avoiding data lost.

16 Claims, 3 Drawing Sheets

US 8,487,777 B2

Figure 1:
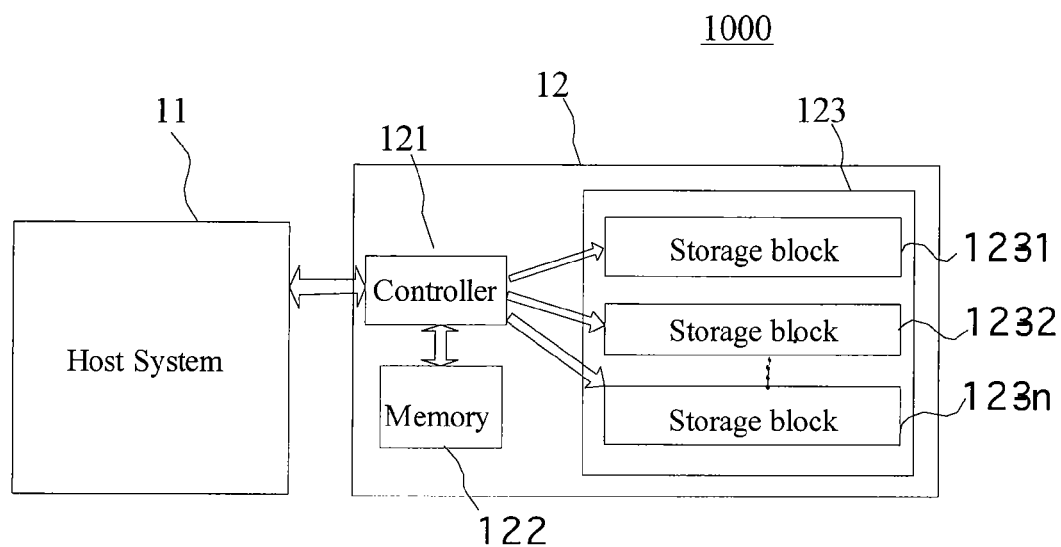

SEMICONDUCTOR STORAGE APPARATUS AND EARLY-WARNING SYSTEMS AND METHODS FOR THE SAME

CROSS-REFERENCE TO RELATED APPLICATIONS:

This application is the U.S. National Stage of International Patent Application No. PCT/CN2009/072717 filed on Jul. 10, 2009, which claims priority to Chinese Patent Application Number 2008-10068480 filed on Jul. 10, 2008, the disclosures of which are hereby incorporated by reference in its entirety.

TECHNICAL FIELD

The present application relates to methods and systems for managing semiconductor storage mediums, as well as semiconductor storage apparatus with an early-warning function.

BACKGROUND

Nowadays, semiconductor storage mediums, such as flash disks, flash cards and semiconductor storage mediums used in products like cell phones and digital cameras, are widely used. With developments of technology, storing capacities, as well as storing densities, of semiconductor storage mediums become larger and larger. However, as a semiconductor storage medium is used, a lifetime thereof is shortened. That is, the semiconductor storage medium may be used for a less number of times. The lifetime of the semiconductor storage medium may comprise a maximum lifetime of the semiconductor storage medium, an average lifetime of the semiconductor storage medium, a threshold, and/or a lifetime of each physical block in the semiconductor storage medium.

Taking a flash medium for example, generally, each block in the flash medium may be erased and written for thousands of times, or even only hundreds or dozens of times. Thus important data may be lost when the lifetime of the semiconductor storage medium expires but the user does not anticipate the expiration. Accordingly, a method for informing the user of an aging extent of the semiconductor storage medium and providing the user with a prompt or warning when a usage limit is to be reached.

SUMMARY

According to one aspect of the present application, an early-warning method for indicating a usage condition of a semiconductor storage device comprising a semiconductor storage medium is provided. The semiconductor storage medium may comprise a plurality of physical storage blocks. The method may comprise:
  retrieving a usage condition value for each of the blocks;
  comparing the usage condition value with a preset threshold; and
  providing an early-warning signal based on the comparison result,
wherein the usage condition value at least comprises one of an average number of used times of the plurality of physical storage blocks, and a maximum number of used times of the plurality of physical storage blocks.

Alternatively, the usage condition value comprises one of $Ave\_T1/Max\_T2$, $(Ave\_T1+Flu\_V)/Max\_T2$, and $Max\_T1/Max\_T2$, wherein $Ave\_T1$ represents an average number of used times of the plurality of physical storage blocks, $Max\_T2$ represents a maximum number of usable times of the plurality of physical storage blocks, $Flu\_V$ is a usage times fluctuation value, and $Max\_T1$ represents a maximum number of used times of the plurality of physical storage blocks.

According to another aspect of the present application, provided is a system for indicating a usage condition of a semiconductor storage device, comprising:
  a host system; and
  a semiconductor storage device comprising a controller and a memory,
  wherein the controller is configured to retrieve a usage condition value of the storage and send the retrieved usage condition value to the host system, and the host system is configured to provide an early-warning signal based on the retrieved usage condition value.

According to a further aspect of the present application, provided is a semiconductor storage device comprising:
  a semiconductor storage medium for storing data;
  a controller configured to retrieve a usage condition value of the semiconductor storage medium; and
  an early-warning module configured to provide an early-warning signal based on the usage condition value under a control of the controller.

DRAWINGS

Figure 2:
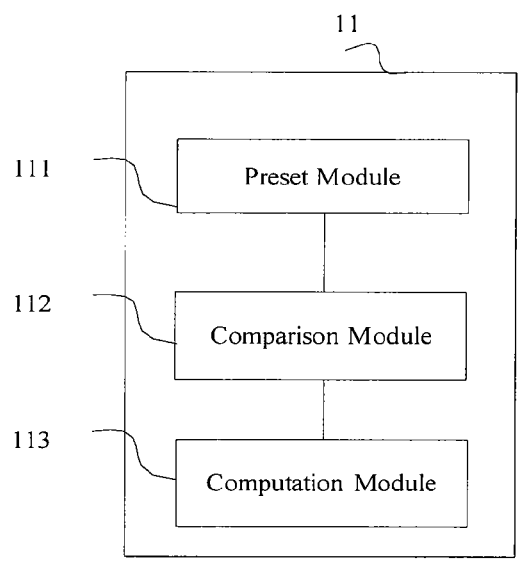
Figure 3:
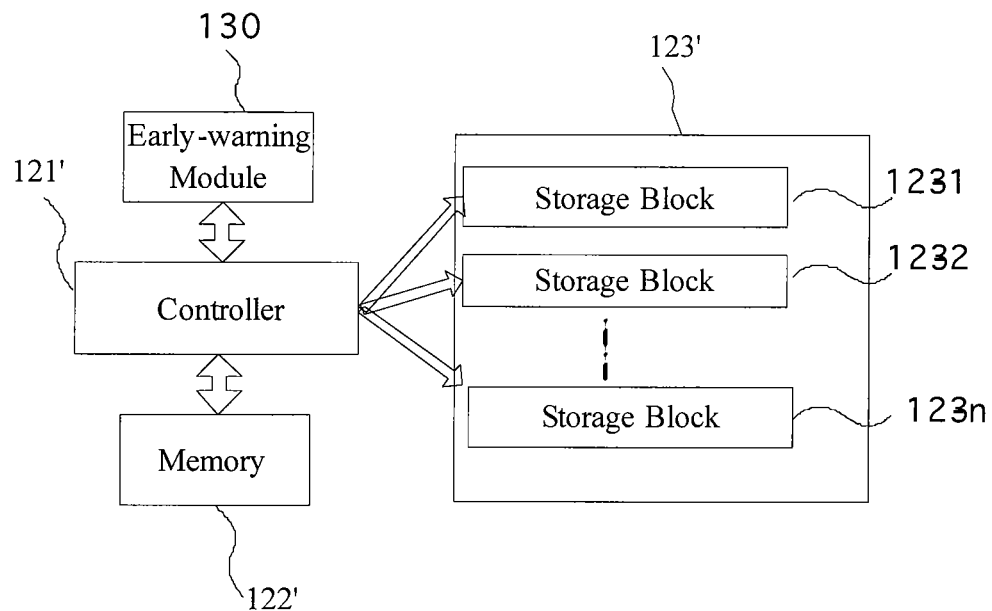
Figure 4:
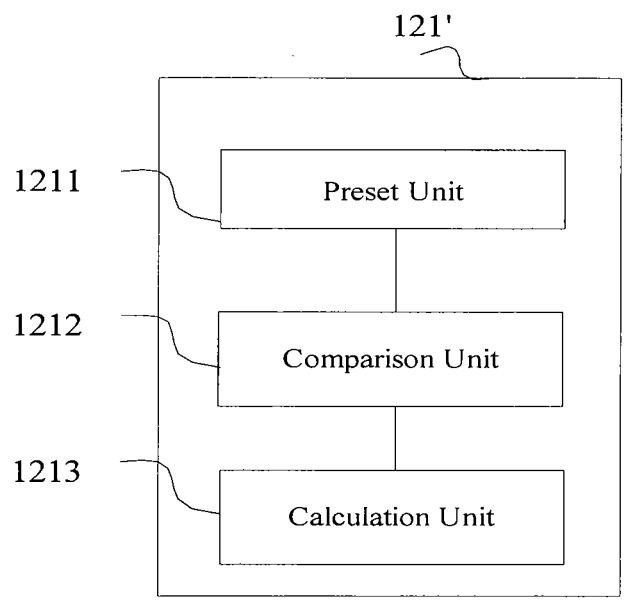
Figure 5:
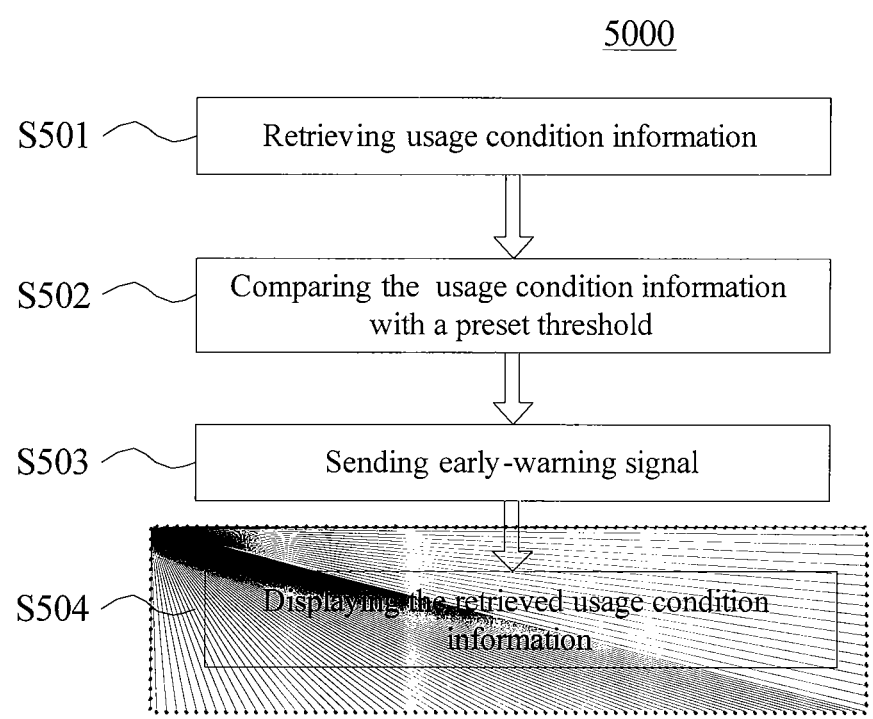

FIG. 1 illustrates an early-warning system for indicating a usage condition of the semiconductor storage device according to the present application;
FIG. 2 illustrates the host system in FIG. 1;
FIG. 3 illustrates a semiconductor storage device being able to indicate a usage condition thereof according to the present application;
FIG. 4 illustrates the controller in FIG. 3; and
FIG. 5 illustrates an early-warning method for indicating a usage condition of the semiconductor storage device according to the present application.

DETAILED DESCRIPTION

Hereinafter, a semiconductor storage device with an early-warning function according to the present application and an early-warning system and a method for indicating a usage condition of the semiconductor storage device will be described in detail with reference to accompanying drawings.

Referring to FIG. 1, an early-warning system 1000 for indicating a usage condition of the semiconductor storage device comprises a host system 11 and a semiconductor storage device 12. The host system 11 may be a device such as a computer or a sever, in which the semiconductor storage device 12 such as a flash hard disk is arranged, or any other device so long as it is capable of accessing the semiconductor storage device 12.

The semiconductor storage device 12 comprises a controller 121, a memory 122 and a semiconductor storage medium 123. The memory 122 is utilized to store information interchanged between the semiconductor storage device 12 and the host system 11, as well as that interchanged between the controller 121 and the semiconductor storage medium 123, temporarily. The semiconductor storage medium 123 comprises a plurality of physical storage blocks 123-1, 123-2, . . . , 123-n. The host system 11 retrieves usage condition information of the plurality of physical storage blocks 123-1, 123-2, . . . , 123-n via the controller 121 and provides early-warning indications based on the retrieved usage condition information. Herein, the usage condition information may be, for example, the number of used times of each of the physical storage blocks 123-1, 123-2, . . . , 123-n, a maximum number of usable times, a maximum number of used times of the physical storage blocks 123-1, 123-2, . . . , 123-n, an average number of usable times for the physical storage blocks 123-1, 123-2, . . . , 123-n, a usage times fluctuation, etc. For example, in the case that the average number of usable times for the plurality of blocks is 2500, the number of usable times of each of the plurality of blocks will be a value between 2300 and 2700 if the usage times fluctuation is set as 200. The above usage condition information may be obtained by using known algorithms such as "balance algorithm".

In particular, the host system 11 sends commands to the controller 121 by protocols, such as SCSI, ATA, SATA, PCI, PCI Express, EMMC, LBA, TCP/IP, to retrieve the usage condition information of the semiconductor storage medium 123. Upon receiving the commands, the controller 121 reads the usage condition information from the semiconductor storage medium 123 and returns the usage condition information to the host system 11 by corresponding protocols.

For information that has been temporarily stored in the memory 122, the controller 121 only needs to return it to the host system 11 simply when retrieving usage condition information of the semiconductor storage medium 123. As for information stored in the semiconductor storage medium 123, the controller 121 has to read it from corresponding positions in the semiconductor storage medium 123. In practice, only a logical address is included in the command sent from the host system 11 to the controller 121. The controller 121 operates to locate a specific physical address in the semiconductor storage medium 123 based on the logical address. Thus, a logical block is required by the controller 121 to obtain the usage condition information of each block in the semiconductor storage medium 123. Generally, to achieve a transformation from the logical address to the physical address, a logical block mapping table may be established to record mapping relationship between each logical block and its corresponding physical blocks. Each logical block may correspond to one or more physical blocks. Information of the physical blocks, such as a block number, a maximum number of usable times or a maximum number of used times thereof, may be recorded in the logical block mapping table. The logical block mapping table may be stored in any position of the physical storage blocks 123-1, 123-2, . . . , 123-n. When receiving a command for accessing a certain logical block from the host system 11, the controller 121 retrieves the logical block mapping table from the semiconductor storage medium 123 and then obtains physical blocks corresponding to the logical block and information of the physical blocks such as the maximum number of usable times and the maximum number used times thereof In an example, for each logical block of the semiconductor storage device 12, the controller 121 reads data from at least one byte in the logical block so that a corresponding logical block mapping table is obtained. Corresponding physical blocks and their usage conditions are also obtained. Thus, once data is read from all logical blocks, usage conditions of physical blocks corresponding to all the logical blocks may be obtained.

It is understood that not all of the physical blocks 123-1, 123-2, . . . , 123-n are corresponding to logical blocks. Some of the physical blocks are used to record special information such as the logical block mapping table, and some of the physical blocks are used as a buffer block or a swap block for speeding the reading/writing up.

Usage conditions of the physical blocks recording mapping relationship such as the logical block mapping table may be obtained by reading the mapping table directly. Mapping table information of some semiconductor devices may comprise mapping tables of different levels. For example, the mapping table information may comprise a first level mapping table recording configuration information of the semiconductor storage device, a second-level mapping table recording information of certain logical regions of the device, and a third-level mapping table recording information of certain logical blocks in the logical regions. Due to the tree structure of the mapping tables, the second-level mapping table may be determined according to the first-level mapping table, and the third-level mapping table may be determined according to the second-level mapping table, and so on. In addition, each mapping table has recorded which physical blocks are associated therewith, as well as the maximum number of usable times and the used times corresponding to each of the physical blocks. So long as firmware provided in the controller 121 retrieves and reads the first-level mapping table, all the second-level mapping levels and then all the third-level mapping levels may be retrieved accordingly. By using the tables, usage conditions of all physical blocks recording the mapping table information are obtained.

Information of physical blocks used as a buffer block or a swap block is recorded in a mapping table (for example, the first-level mapping table) as stated above. For example, the information may comprise the number of the buffer blocks or swap blocks, and their block numbers, maximum numbers of usable times and used times. Thus, the block numbers, the maximum numbers of usable times and used times of the physical blocks may be obtained by using corresponding mapping tables in a manner as stated above.

The configuration information of the semiconductor storage device 12 is stored in a fixed position in one of the physical blocks 123-1, 123-2, . . . , 123-n. When the semiconductor storage device 12 is powered, these blocks will be found by the firmware in the controller 121 and corresponding information will be read. These blocks will not be erased or written any more after being manufactured. Therefore, the usage condition of these blocks, i.e., the maximum number of usable times, is 0 or 1.

Referring to FIG. 2, the host system 11 comprises a preset module 111 and a comparison module 112. An early-warning value is set in the preset module 111. The comparison module 112 compares the usage condition information of the semiconductor storage device with the early-warning value and then provides early-warning according to the comparison result. As an example, the usage condition information may be Ave_T1 or Max_T1, wherein Ave_T1 represents the average number of used times of the physical blocks 123-1, 123-2, . . . , 123-n and Max_T1 represents the maximum number of used times of the physical blocks 123-1, 123-2, . . . , 123-n. Alternatively, the usage condition information may be the total number of used times of a plurality of physical blocks of the blocks 123-1, 123-2, . . . , 123-n. It shall be understood that different usage condition information may correspond to different early-warning values. For example, an early-warning value for the semiconductor storage device 123 with a maximum usage time 5000 may be set as 4800. In this case, if a value Ave_T1 or Max_T1 is larger than the preset early-warning value 4800, an early-warning signal is provided by the comparison module 112. The early-warning signal may be provided in forms of characters, images, sounds or vibrations that can be perceived by humans.

The host system 11 may further comprise a computation module 113 for calculating a usage condition ratio based on the read usage condition information of the semiconductor storage device. For example, the usage condition ratio may comprise one of Ave_T1/Max_T2, (Ave_T1+Flu_V)/

Max_T2, and Max_T1/Max_T2, wherein Ave_T1 represents the average number of used times of the physical blocks 123-1, 123-2, ..., 123-$n$, Max_T2 represents the maximum number of usable times of the physical blocks 123-1, 123-2, ..., 123-$n$, Flu_V is a usage times fluctuation value such as 96%, and Max_T1 represents the maximum number of used times of the physical blocks 123-1, 123-2, ..., 123-$n$. The comparison module 112 compares the usage condition ratio with an early-warning value. If the usage condition ratio is larger than the early-warning value, an early-warning signal may be provided.

For a relatively aged semiconductor, early-warning signals may be provided continuously, which is undesired. To avoid this, the usage condition information may further comprise an early-warning value of step, so that the usage condition ratio is updated with the early-warning value of step after an early-warning signal is provided and a next early-warning signal will be provided when the updated usage condition ratio is achieved. The early-warning value of step may be set via the host system. For example, the early-warning value may be 96% and the early-warning value of step may be 0.5%. In this case, an early-warning signal will be provided when the usage condition ratio reaches 96%. Meanwhile, the early-warning value is added by the early-warning value of step. That is, the early-warning value is updated to be 96.5%. Thus, a next early-warning signal will be provided when the usage condition ratio reaches 96.5%.

After retrieving usage condition information of the semiconductor storage device 12, the host system 11 may display the retrieved usage condition information by a display module (not shown).

Hereinabove, the host system 11 is described to comprise the preset module 111, the comparison module 112, the calculation module and the display module for an illustrative purpose. However, it shall be understood that, without departing from the spirit and scope of the present application, the above four modules may be implemented by more modules or less modules as long as the modules are able to perform the same functions. For example, the host system 11 may comprise a separate early-warning module for providing early-warning signals.

A semiconductor storage device 3000 with an early-warning function according to another aspect of the present application is shown in FIG. 3. As shown, the semiconductor storage device 3000 comprises a controller 121', a memory 122', a semiconductor storage medium 123' composed of storage blocks 123-1, 123-2, ..., 123-$n$, and an early-warning module 130. The memory 122' and the semiconductor storage medium 123' may be the same as the memory 122 and the semiconductor storage medium 123 as discussed above and thus description thereof is omitted.

Referring to FIG. 4, the controller 121' comprises a preset unit 1211 and a comparison unit 1212. An early-warning value is set in the preset unit 1211. The comparison unit 1212 comprises the usage condition information of the semiconductor storage device with the early-warning value. The controller 121' may retrieve the usage condition information of the plurality of physical blocks 123-1, 123-2, ..., 123-$n$ and send the retrieved information to the comparison unit 1212 regularly or each time when a reading/writing operation is applied to the semiconductor storage device 3000. Based on the comparison result, the comparison unit 1212 controls the early-warning module 130 to provide an early-warning signal.

In addition, the controller 121' may comprise a calculation unit 1213 for calculating a usage condition ratio based on the read usage condition information of the semiconductor storage device. The comparison unit 1212 compares the calculated usage condition ratio with the early-warning value preset by the preset unit 1211 and controls the early-warning module 130 to provide an early-warning signal based on the comparison result. Operations of the preset unit 1211, the comparison unit 1212 and the calculation unit 1213 are the same as those of the preset module 111, the comparison module 112 and the calculation module 1213 in the first embodiment, respectively, and descriptions thereon are thus omitted.

In an example, the semiconductor storage device may further comprise a separate display module (not shown) for displaying the usage condition (for example, writing data from or reading data into the semiconductor storage device 3000) and the above-mentioned usage condition value of the semiconductor storage device directly. The semiconductor storage device may be a mobile communication terminal, such as a cell phone, a PDA or the like, or a semiconductor storage device, such as flash disk, a solid state disk or the like.

In the abovementioned embodiments, the early-warning module 130 is arranged in the semiconductor storage device 3000. Alternatively, the early-warning module 130 may be arranged in other devices such as a host in communication with the semiconductor storage device 3000. In this case, the comparison unit 1212 may send a comparison result to the host upon it is available, so that the host may provide the early-warning signal according to the comparison result or display the comparison result directly.

Hereinafter, an early-warning method for indicating a usage condition of the semiconductor storage device according to the present application is discussed. For example, the semiconductor storage device may be the semiconductor storage device 12 or the semiconductor storage device 3000 described above. Hereinafter, an early-warning method 5000 for indicating a usage condition of the semiconductor storage device will be described with reference to the semiconductor storage device 3000.

As shown in FIG. 5, usage condition information of each of the plurality of physical storage blocks 123-1, 123-2, ..., 123-$n$ is retrieved by the controller 121' of the semiconductor storage device 3000 at step 501. Then, the controller 121' compares the retrieved usage condition information with a preset threshold at step 502, and controls the early-warning module 130 to send an early-warning signal at step 503. Optionally, the early-warning method 5000 may further comprise a step 504 for displaying the retrieved usage condition information to the user.

In an example, the usage condition information may comprise at least Ave_T1 or Max_T1, wherein Ave_T1 represents the average number of used times of the physical blocks 123-1, 123-2, ..., 123-$n$ and Max_T1 represents the maximum number of used times of the physical blocks 123-1, 123-2, ..., 123-$n$. Alternatively, the usage condition information may comprise one of Ave_T1/Max_T2, (Ave_T1+Flu_V)/Max_T2, and Max_T1/Max_T2, wherein Ave_T1 represents the average number of used times of the physical blocks 123-1, 123-2, ..., 123-$n$, Max_T2 represents the maximum number of usable times of the physical blocks 123-1, 123-2, ..., 123-$n$, Flu_V is the usage times fluctuation value such as 96%, and Max_T1 represents the maximum number of used times of the physical blocks 123-1, 123-2, ..., 123-$n$.

It shall be understood that the above steps 502-504 may also be implemented in a computer system in connection with the semiconductor storage device, although the early-warning method 5000 has been described with reference to the semiconductor storage device 3000.

In addition, the early-warning value or the usage condition ratio may comprise an early-warning value of step so that the usage condition ratio is updated with the early-warning value of step after an early-warning signal is provided and a next early-warning signal will be provided when the updated usage condition ratio is achieved. In this case, the step 503 may comprise sending a first early-warning signal when the usage condition information reaches the threshold, and increasing the threshold by the early-warning value of step. Once the usage condition ratio reaches the increased threshold, the threshold may increase by the early-warning value of step, and so on.

Hereinabove, embodiments according to the present application have been described for an illustrative purpose. The described embodiments are not intended to limit the scope of the present application in any way. Any suitable modification or equivalents to the described embodiments made by the skilled in the art shall be considered as within the spirit and the scope of the present application.

What is claimed is:

1. An early-warning method for indicating a usage condition of a semiconductor storage device comprising a semiconductor storage medium, the semiconductor storage medium comprising a plurality of physical storage blocks and the method comprising:
   retrieving a usage condition value for each of the blocks;
   comparing the usage condition value with a preset threshold comprising a value of step; and
   providing an early-warning signal based on the comparing, comprising:
      providing a first early-warning signal if the usage condition value reaches the threshold;
      increasing the threshold by the value of step;
      providing a second early-warning signal if the usage condition value reaches the increased threshold; and
   increasing the increased threshold by the value of step,
   wherein the usage condition value comprises one of an average number of used times of the blocks, a maximum number of used times of the blocks, and a total number of used times of the blocks.

2. The method of claim 1, further comprising:
displaying the retrieved usage condition value.

3. The method of claim 1
   wherein the usage condition value comprises one of Ave_T1/Max_T2, (Ave_T1+Flu_V)/Max_T2, and Max_T1/Max_T2,
   wherein Ave_T1 represents an average number of used times of the blocks, Max_T2 represents a maximum number of usable times of the blocks, Flu_V is a usage times fluctuation value, and Max_T1 represents a maximum number of used times of the blocks.

4. An early-warning system, comprising:
a host system comprising:
   a presetting module configured to preset a first early-warning value and a second early-warning value; and
   a comparing module configured to compare the retrieved usage condition value with the first early-warning value and provide an early-warning signal based on the comparing; and
a semiconductor storage device comprising a controller and an early-warning signal,
   wherein the controller is configured to retrieve usage condition value of the early-warning signal and send the retrieved usage condition value to the host system, and the host system is configured to provide an early-warning signal based on the retrieved usage condition value.

5. The system of claim 4, wherein the early-warning signal comprises a plurality of physical storage blocks, and the usage condition value comprises one of an average number of used times of the blocks and a maximum number of used times of the blocks.

6. The system of claim 4, wherein the host system further comprises:
   a calculation module configured to calculate a usage condition ratio of the semiconductor storage device according to the usage condition value;
   wherein the comparing module is further configured to compare the usage condition ratio with the second early-warning value and provide an early-warning signal based on a result of the comparison.

7. The system of claim 6, wherein the first early-warning value comprises a value of step, and the comparing module is further configured to provide an early-warning signal if the usage condition value reaches the first early-warning value and then increase the first early-warning value by the value of step to form an updated early-warning value,
   Wherein the comparing module is configured to provide a second early-warning signal and increase the updated early-warning value by the value of step if the usage condition value reaches the updated early-warning value.

8. The system of claim 6, wherein the early-warning signal comprises a plurality of physical storage blocks, and the usage condition ratio comprises one of Ave_T1/Max_T2, (Ave_T1+Flu_V)/Max_T2, and Max_T1/Max_T2,
   wherein Ave_T1 represents an average number of used times of the blocks, Max_T2 represents a maximum number of usable times of the blocks, Flu_V is a usage times fluctuation value, and Max_T1 represents a maximum number of used times of the blocks.

9. The system of claim 6, wherein the second early-warning value comprises a value of step, and the comparing module is further configured to provide an early-warning signal if the usage condition ratio reaches the second early-warning value and then increase the second early-warning value by the value of step to form an updated early-warning value,
   Wherein the comparing module is configured to provide an early-warning signal again and increase the updated early-warning value by the value of step if the usage condition ratio reaches the updated early-warning value.

10. A semiconductor storage device comprising:
a semiconductor storage medium for storing data;
a controller configured to retrieve a usage condition value of the semiconductor storage medium; and
an early-warning module configured to provide an early-warning signal based on the usage condition value under a control of the controller,
   wherein the controller further comprises:
      a presetting module configured to preset a first early-warning value and a second early-warning value; and
      a comparing module configured to compare the retrieved usage condition value with the first early-warning value,
   wherein the controller provides an early-warning signal based on a result of the comparison.

11. The device of claim 10, further comprising:
a display module configured to display the usage condition value of the semiconductor storage medium.

12. The device of claim 10, the controller further comprising:
   a calculating module configured to calculate a usage condition ratio based on the usage condition value, wherein the comparison module is further configured to compare the usage condition ratio with the second early-warning value and send a result of the comparison to the controller, and the controller is configured to provide an early-warning signal according to the result.

13. The device of claim 12, wherein the first early-warning value comprises a value of step, and the controller is further configured to:
provide an early-warning signal if the usage condition value reaches the first early-warning value and then increase the first early-warning value by the value of step to form an updated early-warning value, and
provide an early-warning signal again and increase the updated early-warning value by the value of step if the usage condition value reaches the updated early-warning value.

14. The device of claim 12, wherein the second early-warning value comprises a value of step, and the controller is further configured to:
provide an early-warning signal if the usage condition ratio reaches the second early-warning value and then increase the second early-warning value by the value of step to form an updated early-warning value, and
provide an early-warning signal again and increase the updated early-warning value by the value of step if the usage condition ratio reaches the updated early-warning value.

15. The device of claim 10, wherein the semiconductor storage medium comprises a plurality of physical storage blocks, and the usage condition value comprises $Ave\_T1$ or $Max\_T1$,
wherein $Ave\_T1$ represents an average number of used times of the blocks, $Max\_T1$ represents a maximum number of used times of the blocks.

16. The device of claim 10, wherein the semiconductor storage medium comprising a plurality of physical storage blocks, and the usage condition value comprises one of $Ave\_T1/Max\_T2$, $(Ave\_T1+Flu\_V)/Max\_T2$, and $Max\_T1/Max\_T2$,
wherein $Ave\_T1$ represents an average number of used times of the blocks, $Max\_T2$ represents a maximum number of usable times of the blocks, $Flu\_V$ is a usage times fluctuation value, and $Max\_T1$ represents a maximum number of used times of the blocks.

* * * * *